(12) United States Patent     (10) Patent No.:   US 12,666,509 B2
Bretschneider et al.     (45) Date of Patent:   *Jun. 23, 2026

(54) LIFETIME COLOR STABILIZATION OF COLOR-SHIFTING ARTIFICIAL LIGHT SOURCES

(71) Applicant: Quarkstar LLC, Las Vegas, NV (US)

(72) Inventors: Eric Bretschneider, Corinth, TX (US); Louis Lerman, Las Vegas, NV (US); Hans Peter Stormberg, Stolberg (DE)

(73) Assignee: Quarkstar LLC, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/639,032

(22) Filed: Apr. 18, 2024

(65) Prior Publication Data

US 2025/0089136 A1     Mar. 13, 2025

Related U.S. Application Data

(63) Continuation of application No. 17/742,324, filed on May 11, 2022, now Pat. No. 11,991,801, which is a (Continued)

(51) Int. Cl.
    *H05B 45/22*       (2020.01)
    *H05B 45/24*       (2020.01)
    (Continued)

(52) U.S. Cl.
    CPC ............. *H05B 45/22* (2020.01); *H05B 45/24* (2020.01); *H05B 45/28* (2020.01); *H10H 20/8512* (2025.01); *H10H 20/0361* (2025.01)

(58) Field of Classification Search
None
See application file for complete search history.

(56) References Cited

U.S. PATENT DOCUMENTS

| | | | |
|---|---|---|---|
| 8,013,533 B2* | 9/2011 | De Rijck | G09G 3/3413 |
| | | | 315/156 |
| 8,035,320 B2* | 10/2011 | Sibert | H05B 47/197 |
| | | | 315/318 |

(Continued)

FOREIGN PATENT DOCUMENTS

| | | | | |
|---|---|---|---|---|
| WO | WO 2008/146219 | 12/2008 | | |
| WO | WO-2008146219 A1 * | 12/2008 | ........... | A61N 5/0618 |

(Continued)

OTHER PUBLICATIONS

International Search Report and Written Opinion in International Appln. No. PCT/US2018/020292, mailed on May 15, 2018, 17 pages.

*Primary Examiner* — Srinivas Sathiraju
(74) *Attorney, Agent, or Firm* — Fish & Richardson P.C.

(57)         ABSTRACT

A system includes two or more phosphor-containing white LEDs (or other color-shifting artificial light sources) selected so that their combined color shift over at least 8,000 hours (e.g., at least 10,000 hours, at least 20,000 hours, at least 30,000 hours, at least 40,000 hours, up to 200,000 hours, up to 100,000 hours, up to 80,000 hours) of operation is less than at least one of the LED's (or the other color-shifting artificial light source's) color shift over that time. Here, the combined color shift ($\Delta u'v'$) over the at least 8,000 hours (e.g., at least 10,000 hours, at least 20,000 hours, at least 30,000 hours, at least 40,000 hours, up to 200,000 hours, up to 100,000 hours, up to 80,000 hours) of operation can be less than 0.007 (e.g., 0.006 or less, 0.005 or less, 0.004 or less, 0.003 or less, 0.002 or less, 0.001 or less, 0.0005 or less).

19 Claims, 12 Drawing Sheets

Stages of LED Color Point Stability

Related U.S. Application Data continuation of application No. 16/488,463, filed as application No. PCT/US2018/020292 on Feb. 28, 2018, now Pat. No. 11,337,282.

(60) Provisional application No. 62/629,684, filed on Feb. 12, 2018, provisional application No. 62/465,116, filed on Feb. 28, 2017.

(51) Int. Cl.
| | |
|---|---|
| *H05B 45/28* | (2020.01) |
| *H10H 20/01* | (2025.01) |
| *H10H 20/851* | (2025.01) |

(56) References Cited

U.S. PATENT DOCUMENTS

| | | | | |
|---|---|---|---|---|
| 8,471,496 | B2 * | 6/2013 | Knapp | H04L 12/43 |
| | | | | 315/307 |
| 8,521,035 | B2 * | 8/2013 | Knapp | H04L 12/437 |
| | | | | 398/103 |
| 8,773,336 | B2 * | 7/2014 | Knapp | H05B 45/10 |
| | | | | 345/82 |
| 8,974,087 | B2 | 3/2015 | Moeck et al. | |
| 9,414,459 | B2 * | 8/2016 | Johannessen | H05B 45/46 |
| 9,521,721 | B2 * | 12/2016 | Beczkowski | H05B 45/12 |
| 9,827,439 | B2 * | 11/2017 | Maxik | G16H 50/20 |
| 10,264,637 | B2 * | 4/2019 | van de Ven | H05B 45/48 |
| 11,337,282 | B2 * | 5/2022 | Bretschneider | H05B 45/28 |
| 11,991,801 | B2 * | 5/2024 | Bretschneider | H05B 45/28 |
| 2003/0128313 | A1 * | 7/2003 | Kaminsky | G02B 5/0268 |
| | | | | 349/112 |
| 2005/0135094 | A1 * | 6/2005 | Lee | H01L 25/0753 |
| | | | | 257/E25.02 |
| 2007/0052375 | A1 * | 3/2007 | Lin | H05B 45/22 |
| | | | | 315/312 |
| 2007/0222399 | A1 | 9/2007 | Bondy et al. | |
| 2008/0265799 | A1 * | 10/2008 | Sibert | H05B 47/197 |
| | | | | 315/292 |
| 2009/0244113 | A1 | 10/2009 | Bergquist et al. | |
| 2009/0246895 | A1 * | 10/2009 | You | H05B 45/00 |
| | | | | 438/20 |
| 2010/0174345 | A1 * | 7/2010 | Ashdown | H05B 45/22 |
| | | | | 607/88 |
| 2011/0309746 | A1 * | 12/2011 | Eckel | H05B 47/198 |
| | | | | 315/297 |
| 2011/0317398 | A1 | 12/2011 | Moeck et al. | |
| 2012/0013257 | A1 * | 1/2012 | Sibert | H05B 47/175 |
| | | | | 315/312 |
| 2012/0032600 | A1 * | 2/2012 | Edwards | H05B 47/175 |
| | | | | 315/151 |
| 2013/0107515 | A1 * | 5/2013 | You | F21V 9/20 |
| | | | | 362/231 |
| 2014/0225529 | A1 * | 8/2014 | Beczkowski | H05B 45/22 |
| | | | | 315/297 |
| 2014/0312777 | A1 * | 10/2014 | Shearer | H05B 47/105 |
| | | | | 315/151 |
| 2015/0245436 | A1 | 8/2015 | Markytan et al. | |
| 2015/0270451 | A1 | 9/2015 | Chowdhury et al. | |
| 2016/0075162 | A1 * | 3/2016 | Lefebvre | B41F 11/02 |
| | | | | 250/492.1 |
| 2016/0116124 | A1 * | 4/2016 | Podowitz | H05B 45/3574 |
| | | | | 362/84 |
| 2016/0219673 | A1 | 7/2016 | Jaeger | |
| 2020/0037412 | A1 * | 1/2020 | Bretschneider | H10H 20/8512 |
| 2022/0102583 | A1 * | 3/2022 | Baumheinrich | G02B 6/12007 |
| 2023/0109630 | A1 * | 4/2023 | Bretschneider | H05B 45/28 |
| | | | | 315/151 |
| 2025/0089136 | A1 * | 3/2025 | Bretschneider | H10H 20/851 |

FOREIGN PATENT DOCUMENTS

| | | | | |
|---|---|---|---|---|
| WO | WO 2009/120325 | 10/2009 | | |
| WO | WO-2009120325 A1 * | 10/2009 | | G09G 5/026 |
| WO | WO 2009/136344 | 11/2009 | | |
| WO | WO 2013/041109 | 3/2013 | | |
| WO | WO 2013/056012 | 4/2013 | | |

* cited by examiner

Example 1

- DCA input = 2 – 14 khrs
- Close agreement over long time intervals
- Rolling time window not required for accuracy

Example 1

- Limiting data to 2,000 hours + increases accuracy of projection
- Prediction converges as analysis interval increases
- 6khr → CS7 error ~8%
- 7khr → CS7 error ~3%

Example 2

- 6,000 hour data shows apparent stability
- DCA predicts (surprising) recovery and then upswing
- 14,000 hour data closely mirrors the prediction
- 8,000 DCA prediction closely matches full data

Example 2

- Behavior change at 5,000 hours
- 6khr → CS7 error ~17%
- 7khr → CS7 error ~12%
- 8khr → CS7 error < 3%

Example 3

- 6,000 hour data shows apparent stability
- DCA predicts recovery followed by emergence
- Full data shows recovery
- DCA matches full data
- Extrapolating forward still predicts emergence

Example 3

- 6khr → CS7 error ~17%
- 7khr → CS7 error ~5%
- Final blue shift begins *after* 7khr data

Example 4

- 6,000 hour data looks exceptional
- $\Delta u'v' \leq 0.0006$
- 2 - 6khr change in $\Delta u'v'$ = 0.000212
- DCA predicts imminent emergence
- 6khr DCA pessimistic
- 7khr DCA accurate

Example 4

- 6khr → CS7 error ~21%
- 7khr → CS7 error <1%
- Rapid convergence achieved despite complex chromaticity behavior

LIFETIME COLOR STABILIZATION OF COLOR-SHIFTING ARTIFICIAL LIGHT SOURCES

CROSS-REFERENCE TO RELATED APPLICATIONS

This application is a continuation of U.S. patent application Ser. No. 17/742,324 filed May 11, 2022, which is a continuation of U.S. patent application Ser. No. 16/488,463, filed Aug. 23, 2019, which is a National Stage Application under 35 U.S.C. § 371 and claims the benefit of International Application No. PCT/US2018/020292, filed Feb. 28, 2018, which claims the benefit of priority under 35 U.S.C. § 119(e)(1) of U.S. Provisional Application No. 62/465,116, filed on Feb. 28, 2017, and of U.S. Provisional Application No. 62/629,684, filed on Feb. 12, 2018, all of which are incorporated by reference herein.

BACKGROUND

White light emitting diodes ("white LEDs") are widely used in many applications requiring broadband visible illumination, such as area lighting, automotive lighting, and backlighting in flat panel displays.

In many cases, white LEDs are formed by combining LED dies of one color (mostly blue LEDs, e.g., made of InGaN) with phosphors of different colors (e.g., yellow, such as a YAG phosphor). A portion of the light emitted from the LED die is converted to longer wavelength light by the phosphor. The combined output from LED die and the phosphor provides broadband nominally white light. The devices composed of the LED die and the phosphor are called phosphor-based or phosphor-converted white LEDs (or, in this disclosure, simply "white LEDs" for short).

Significant efforts have been made to maintain the brightness of white LEDs over their lifetime but, until now, less attention has been paid to how the color (chromaticity) of such LEDs might vary over their lifetime.

SUMMARY

It has been learned that the color of a phosphor-based white LED can shift significantly over the lifetime of the LED. This color change can be undesirable, especially where it results in the emitted light drifting from its manufacturer-specified color and/or becomes noticeable to the human eye (which is extremely sensitive to color changes).

Understanding the causes of the chromaticity shift can allow one to reduce its effects through judicious material selections and/or manufacturing techniques.

Moreover, understanding how the chromaticity shift occurs and being able to predict its behavior can allow one to compensate for its effects over the lifetime of the LED. Alternatively, or additionally, being able to predict the LED's color shift allows a manufacturer to accurately specify its behavior and the end user of the LED to account for the anticipated shift in applications.

The ability to predict the color shift of an LED over long periods of time is an important advance in LED technology. To date LED lifetime has been rated based on lumen depreciation. This is the reduction in the total luminous flux over time as the LED ages. The lumen maintenance is expressed as a percentage of the initial luminous flux. A typical end of life based on this criterion is a lumen maintenance of 70%.

Human beings are relatively insensitive to small shifts in light intensity, but are highly sensitive to even small shifts in color. Hence for many applications of LEDs in lighting, it is even more important to be able to understand, predict, and (ideally) control changes in color.

An example is when selecting unpackaged foodstuffs in a grocery store where one's selections often depend on subtle differences in the color and visual texture of the foodstuffs on display. Beyond retail establishments in general, other places where color stability is paramount include museums and wherever art is displayed, and healthcare facilities where both diagnostic and rehabilitation efforts can be strongly effected by the subtleties of light and lighting. Industrial and manufacturing operations, especially quality control, can also be highly dependent on a stably lit color environment in the factory or work area.

Also important, across a broad range of indoor and outdoor applications, is the ubiquitous situation where multiple sources or luminaires are intended to provide even illumination, for example of architectural or advertising surfaces. Wall-wash, grazer, and cove lighting situations are examples of this.

A summary of various aspects of the invention follow:

In general, in one aspect, the invention features a system that includes: two or more phosphor-containing white LEDs selected so that their combined color shift over at least 8,000 hours (e.g., at least 10,000 hours, at least 20,000 hours, at least 30,000 hours, at least 40,000 hours, at least 50,000 hours, up to 200,000 hours, up to 100,000 hours, up to 80,000 hours) of operation is less than at least one of the LEDs color shift over that time.

Embodiments of the system can include one or more of the following features and/or features of other aspects. For example, the combined color shift ($\Delta u'v'$) over at least 8,000 hours (e.g., at least 10,000 hours, at least 20,000 hours, at least 30,000 hours, at least 40,000 hours, at least 50,000 hours, up to 200,000 hours, up to 100,000 hours, up to 80,000 hours) of operation can be less than 0.007 (e.g., 0.006 or less, 0.005 or less, 0.004 or less, 0.003 or less, 0.002 or less, 0.001 or less, 0.0005 or less).

The system can be a bulb including the two or more phosphor-containing white LEDs, a luminaire including the two or more phosphor-containing white LEDs, or can include multiple bulbs and/or luminaires including the two or more phosphor-containing white LEDs.

The system can include current varying means configured to selectively vary a relative current to each of the two or more phosphor-containing white LEDs in order to vary their relative brightness. Here, the current varying means can include a feedback loop or a feedforward loop based on which the relative current to each of the two or more phosphor-containing white LEDs is selectively varied. The feedback loop can include at least one sensor associated with the two or more phosphor-containing white LEDs, the at least one sensor configured to produce feedback information based on which the feedback loop is operated. The sensor can be one or more of a current sensor, a temperature sensor and a spectral sensor.

The two or more phosphor-containing white LEDs can be combined based on a predicted color shift for each of the LEDs. For example, the color shift can be predicted based on a measurement of the two or more phosphor-containing white LEDs' actual color shift over a period of time of at least 1000 hours. Moreover, the color shift can be predicted based on the measurement of the two or more phosphor-containing white LEDs' actual color shift over a period of time which is larger than 2,000 hours, 3,000 hours, 4,000 hours, 5,000 hours, or 6,000 hours, and smaller than 8,000 hours. As another example, the color shift can be predicted based on a model. The model can include a Differential Chromaticity Algorithm (DCA) model, in which chromaticity shifts depend linearly of time. Here, the two or more phosphor-containing white LEDs can be combined based on a predicted lumen maintenance for each of the LEDs, and the lumen maintenance for each of the LED can be predicted based on the model that further includes an exponential decay of lumen maintenance. The model can be performed using either (X, Y, Z) tri-stimulus coordinates, or (Y, u, v)-coordinates, or both.

In general, in another aspect, the invention features a system that includes a first light emitting diode (LED) configured to output first light having a first color shift at a number of operating hours; and a second LED configured to output second light having a second color shift at said number of operating hours, the second color shift being different from the first color shift. Here, the first and second LEDs are selected during assembly of the system based on the first and second color shifts to provide a combination of the first and second light having a combined color shift at said number of operating hours that is less than the smaller of the first and second color shifts.

Implementations of the system can include one or more of the following features and/or features of other aspects. For example, the combined color shift can continue to be less than the smaller of the first and second color shifts for a range of operating hours extending beyond said number of operating hours. Here, the number of operating hours can be 8000 hours and the range of operating hours can be 50000.

The first and second LEDs can be selected during assembly of the system additionally based on intended operating conditions of the system. Here, the intended operating conditions of the system can include cumulative weighted dimming levels of the first and second LEDs.

The foregoing first and second color shifts can be expressed in a two-dimensional vector space. The system can be a bulb including the first and second LEDs, a luminaire including the first and second LEDs, or can include multiple bulbs and/or luminaires including the first and second LEDs. Moreover, at least one of the first and second LEDs can be a phosphor-containing white LED.

In general, in another aspect, the invention features a method that includes combining two or more phosphor-containing white LEDs so that their combined color shift over at least 8,000 hours (e.g., at least 10,000 hours, at least 20,000 hours, at least 30,000 hours, at least 40,000 hours, at least 50,000 hours, up to 200,000 hours, up to 100,000 hours, up to 80,000 hours) of operation is less than at least one of the LEDs color shift over that time.

Implementations of the method can include one or more of the following features and/or features of other aspects. For example, the combined color shift (Δu'v') over at least 8,000 hours (e.g., at least 10,000 hours, at least 20,000 hours, at least 30,000 hours, at least 40,000 hours, at least 50,000 hours, up to 200,000 hours, up to 100,000 hours, up to 80,000 hours) of operation can be less than 0.007 (e.g., 0.006 or less, 0.005 or less, 0.004 or less, 0.003 or less, 0.002 or less, 0.001 or less, 0.0005 or less).

The LEDs can be combined based on a predicted color shift for each LED. The color shift can be predicted based on a measurement of their actual color shift over a period of time (e.g., at least 1,000 hours, at least 2,000 hours, at least 3,000 hours, at least 4,000 hours, at least 5,000 hours, at least 6,000 hours, up to 8,000 hours. The color shifts can be predicted based on a model, such as a Differential Chromaticity Algorithm (DCA) model, in which chromaticity shifts depend linearly of time. As such, the LEDs can combined based on a predicted lumen maintenance for each LED, and the lumen maintenance for each LED is predicted based on the model that further includes an exponential decay of lumen maintenance. Moreover, the model can be performed using either (X, Y, Z) tri-stimulus coordinates, or (Y, u, v)-coordinates, or both.

The two or more LEDs can be combined in a bulb. The two or more LEDs can be combined in a luminaire. The two or more LEDs can be combined in a lighting system including multiple bulbs.

In some embodiments, the method further includes selectively varying the relative current to each of the LEDs in order to vary their relative brightness. The relative current can be varied based on a feedback loop or a feedforward loop. The feedback loop can be based on information from at least one sensor associated with the two or more LEDs. The at least one sensor can include a current sensor, a temperature sensor, and/or a spectral sensor.

In general, in another aspect, the invention features a phosphor-containing white LED, including: an LED die; and a phosphor-containing material positioned to receive radiation from the LED die. The phosphor-containing material includes: a binder; phosphor particles dispersed through the binder; and a phosphor stabilization means. The phosphor stabilization means reduces an amount a color shift (Δu'v°) of the LED during the first 2,000 hours or more (e.g., during the first 3,000 hours, the first 4,000 hours, the first 5,000 hours, the first 6,000 hours) of use of the LED.

Embodiments of the LED can include one or more of the following features and/or features of other aspects. For example, the phosphor stabilization means can mechanically stabilize the distribution of the phosphor particles in the binder. The phosphor stabilization means can include anisotropic particles. For example, the anisotropic particles can include carbon nanotubes, silicon carbide, silk and/or polymer filaments. In some embodiments, the phosphor stabilization means includes a cross-linked polymer network. The phosphor stabilization means can chemically stabilize the distribution of the phosphor particles in the binder.

In general, in another aspect, the invention features a method that includes: treating one or more components of a phosphor-containing white LED to a phosphor stabilization means to reduce an amount a color shift (Δu'v°) of the LED during the first 2,000 hours or more (e.g., during the first 3,000 hours, the first 4,000 hours, the first 5,000 hours, the first 6,000 hours) of use of the LED.

Implementations of the method can include one or more of the following features and/or features of other aspects. For example, the color shift (Δu'v') during the first 2,000 hours or more (e.g., during the first 3,000 hours, the first 4,000 hours, the first 5,000 hours, the first 6,000 hours) is less than 0.004 (e.g., 0.003 or less, 0.002 or less, 0.001 or less, 0.0005 or less).

Treating one or more components of a phosphor-containing white LED to a phosphor stabilization means can include exposing the one or more components to electromagnetic radiation (e.g., UV light, blue light). The radiation can be provided by an external radiation source. The external radiation source can be a laser. The external radiation source can be an incoherent radiation source. In some embodiments, the radiation is provided by a component of the phosphor-containing white LED.

Treating one or more components of a phosphor-containing white LED to a phosphor stabilization means can include exposing the one or more components to radiation with electrons or protons.

Treating one or more components of a phosphor-containing white LED to a phosphor stabilization means can include exposing the one or more components to heat.

Treating one or more components of a phosphor-containing white LED to a phosphor stabilization means can include exposing the one or more components to a chemical reagent (e.g., an oxidizing agent, such as oxygen) (e.g., a liquid or gaseous chemical reagent) (e.g., water).

Treating one or more components of a phosphor-containing white LED to a phosphor stabilization means can include exposing the one or more components to two or more phosphor stabilization means. The one or more components can be treated to the phosphor stabilization means simultaneously or sequentially.

The one or more components can be treated after assembly of the phosphor-containing white LED. Alternatively, or additionally, the one or more components can be treated prior to or during assembly of the phosphor-containing white LED.

The one or more components can be a phosphor-containing material and the phosphor stabilization means can be a component material of the phosphor-containing material. The phosphor-containing material can include phosphor particles and a binder and the component material stabilizes a distribution of the phosphor particles in the binder. The component material can mechanically stabilize the distribution of the phosphor particles in the binder. The component material includes anisotropic particles. The anisotropic particles can include carbon nanotubes, silicon carbide, silk and/or polymer filaments. In some embodiments, the component material includes a cross-linked polymer network.

The component material can chemically stabilize the distribution of the phosphor particles in the binder.

In general, in a further aspect, the invention features a method that includes: measuring changes to a color of a phosphor-containing white LED during at least 500 hours (e.g., at least 1,000 hours, at least 2,000 hours, at least 3,000 hours, at least 4,000 hours, at least 5,000 hours, at least 6,000 hours, up to 8,000 hours) of use of the LED; predicting how the color of the white LED will change for at least 5,000 hours (e.g., at least 10,000 hours, at least 15,000 hours, at least 20,000 hours, at least 30,000 hours, at least 40,000 hours, at least 50,000 hours, up to 200,000 hours, up to 100,000 hours, up to 80,000 hours) of additional use based on the measurement; and characterizing the white LED based on the predicted change.

Implementations of the method can include one or more of the following features and/or features of other aspects. For example, characterizing the white LED can include binning the LED according to the predicted change.

Lumen Maintenance and Color Stability are the two performance features most critical for a given job. The degree of color stability that is required, or simply not acceptable, depends on the task at hand. What is acceptable for one task and time-scale may be considered insufficient for another.

Considering that it has not been possible previously to make such color-related predictions, the ability to predict color performance from an initial set of test results offers many advantages.

Amongst other opportunities, this will allow a much greater suite of experiments to be performed whose results will further inform and enhance the optimization of color stability. With such experiments otherwise taking years to complete, the ability to get critical information from normal usage in less than a single year is crucial. In this context, this new approach offers even greater possibilities to catalyze fundamental advancements of the underlying technology. Working within this approach to determine ways to further accelerate the 'aging' of an LED package, accompanied by the commensurate ability to determine the 'stages' of color shift evolution, can have important implications for both experimental and industrial applications. Much more rapid progress in LED technology can result from such compressed time scales, as can prior testing and 'binning' by color stability performance for specialized and color-critical uses.

Example embodiments of the invention can feature white LEDs that exhibit smaller initial color shifts during their lifetime than conventional LEDs. Such embodiments can feature phosphor-containing materials that have increased lifetime stability compared to conventional phosphor-containing materials. Increased stability of the phosphor-containing materials can result in smaller lifetime color shifts of the LED. Alternatively, or additionally, embodiments can feature more stable interfaces between the phosphor-containing material and the LED die than conventional LEDs. Other embodiments can provide for a more stable optical relationship between the phosphor-containing material and the LED die than conventional LEDs. These embodiments can result in dramatically reduced color shift over the lifetime of the LED.

Certain embodiments feature LED-based lamps that exhibit greater color stability over their lifetime than conventional LED lamps. For example, knowing how an individual white LED's color is expected to shift over time allows combinations of multiple white LEDs that together have smaller color shift than any of the individual LEDs included in the combination. This can be fundamental to the creation of new types of lighting devices that have a higher degree of performance, for longer periods of time. This may also mitigate the need for sensors (e.g., spectral sensors) and feedback loops to maintain within desired limits the color of the combined light provided by combinations of LEDs or other forms of light-emitting elements including LED packages, LED bulb (including alternative optics), hybrid LED devices (e.g., white LEDs+red LEDs), LED luminaires, primary color sources (without phosphors), non-LED sources, lasers, super-luminescent devices.

Other features and advantages will be apparent from the description below and the claims.

BRIEF DESCRIPTION OF THE DRAWINGS

Like symbols in different figures indicate like elements.

DETAILED DESCRIPTION

Figure 1A:
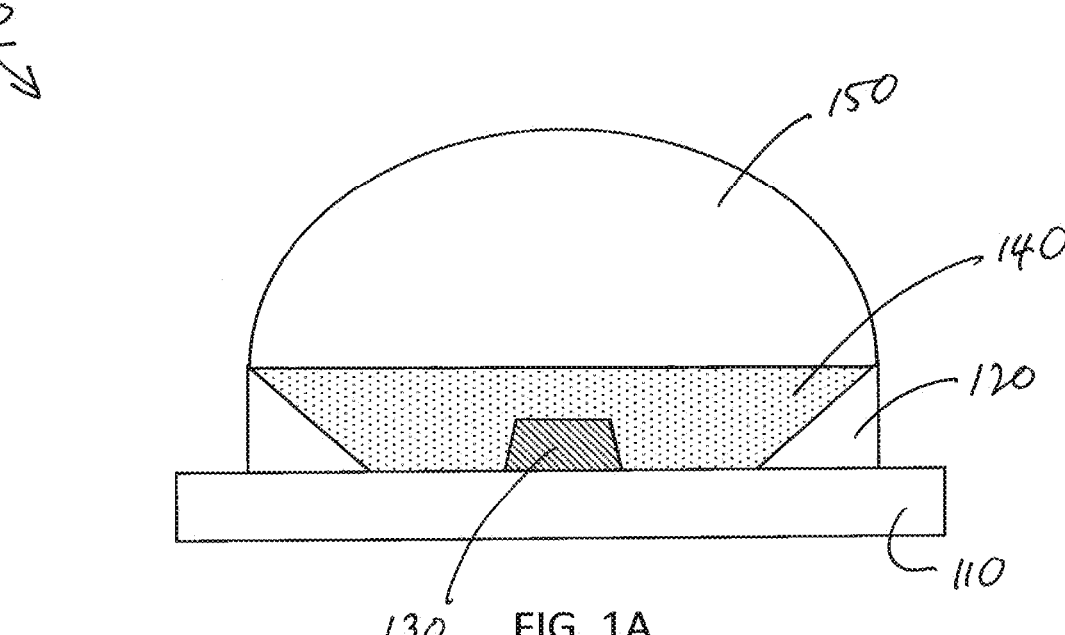
FIG. 1A shows a cross-sectional view of an embodiment of a phosphor-based white LED.
Figure 1B:
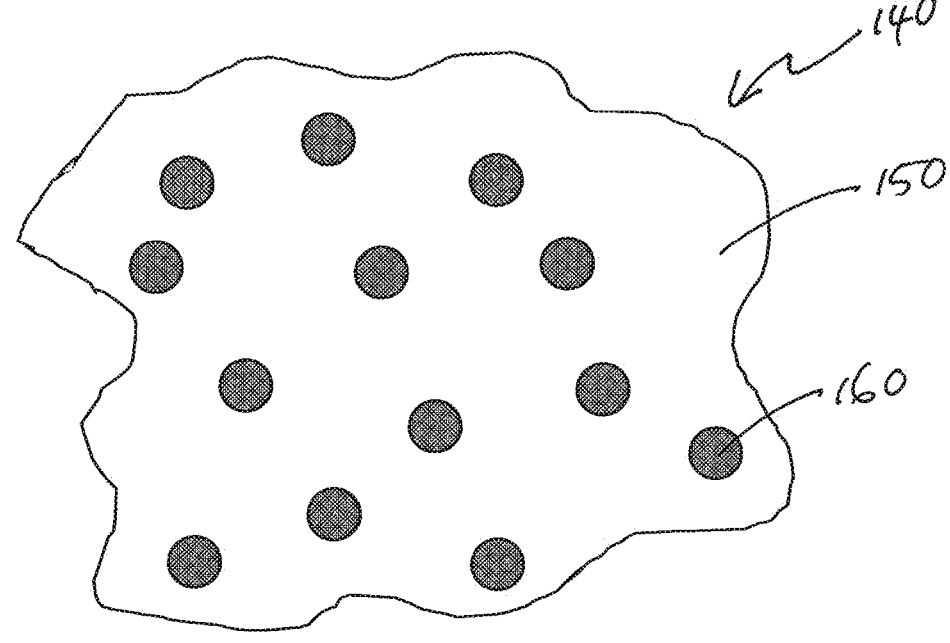
FIG. 1B shows an embodiment of a phosphor-containing material formed from a dispersion of phosphor particles in a binder.

Referring to FIG. 1A, a phosphor-based white LED 100 includes a substrate (e.g., a printed circuit board) 110, a pump LED die 130 (alternatively referred to as a LED chip), a phosphor-containing material 140 adjacent the LED die, and a rim 120 forming a cavity for receiving the phosphor-containing material. A lens 150 is positioned opposite the LED die and phosphor-containing material from the substrate. Referring also to FIG. 1B, the phosphor-containing material 140 is formed from particles 160 of one or more phosphors that are dispersed in a continuous binder 150.

During operation, a current is applied across LED die 130 causing the LED die to emit light in a relatively narrow emission wavelength band. This light exits the die and enters the phosphor-containing material. A portion of the light is transmitted through the phosphor-containing material and exits LED 100 through lens 150. A portion of the light is scattered due to the difference in refractive index between the phosphor particles and the binder and exits LED 100 through lens 150. For example, the refractive index of YAG phosphors are about 1.80-1.82 versus 1.5-1.6 for conventional binder materials. A portion of the light from the LED die is absorbed by the phosphor particles and emitted as light with a different wavelength before exiting LED 100 through lens 150. Some of the light reflects from the substrate or rim of the cavity before exiting the LED.

Some pump LED dies emit light in a range from about 400 nm to about 500 nm. For example, certain InGaN LED dies emit light in a range from about 400 nm to about 450 nm. ZnSe and some InGaN LED dies emit light in a range from about 450 nm to about 500 nm.

Commonly used phosphors emit light in a range from about 500 nm to about 700 nm. For example, Cerium-doped YAG phosphors can emit light in this wavelength range.

Binder 150 is typically a polymeric material selected for its compatibility with the phosphor particles and manufacturing processes, optical properties, and other physical properties (e.g., thermal conductivity, mechanical properties). Binder materials may include dimethyl silicones, phenyl silicones, epoxies, acrylics (e.g., PMMA), sol-gels, and polycarbonate.

Generally, phosphor-based white LEDs can include additional components (e.g., wire leads) in addition to those illustrated in FIG. 1A. Moreover, while FIG. 1A illustrates just one architecture of a phosphor-based white LED, the principles and techniques disclosed can be applied to a variety of LED architectures. For example, some phosphor-based white LEDs do not include a cavity for holding the phosphor-containing material. For instance, the phosphor-containing material can be applied as a pre-molded of pre-formed component that is placed over the chip. In another example, the phosphor-containing material can be applied over the chip as a conformal coating. Still other designs, such as remote-phosphor designs, are possible.

Generally, the light emitted by the phosphor is Stokes shifted to a longer wavelength than the light from the LED die. The resulting emission from LED 100 is therefore a combination of light in the emission wavelength band from the LED die and the Stokes shifted light from the phosphor. The precise color of this light therefore depends on the emission spectrum of the LED die, the spectrum of the Stokes shifted light, and the relative amounts of each.

Differential Chromaticity Algorithm (DCA) Model for Predicting Color Shifts of an Emission Spectrum of LED Dies It has been observed that the color of phosphor-based white LEDs can vary over time. The sensitivity of the human eye to color shift may be expressed in terms of a distance between the initial chromaticity coordinates of the LED and the chromaticity coordinates at a later point in time. For this purpose, the CIE 1976 u'v' chromaticity diagram is typically used. Using this chromaticity diagram, the time-varying color shift on a white LED may be given by $$\Delta u'v' = \sqrt{(u'_0 - u'_t)^2 + (v'_0 - v'_t)^2}. \tag{1}$$

In EQ. (1), $(u'_0, v'_0)$ are the chromaticity coordinates at time 0 and $(u'_t, v'_t)$ are the chromaticity coordinates at time t. For specialty lighting applications, a change in chromaticity coordinates as small as Δu'v'=0.002 may be considered unacceptable. For more general applications, the change in chromaticity coordinates before a color shift is deemed excessive ranges from Δu'v'=0.004 to 0.007.

Figures 2A, 2B:
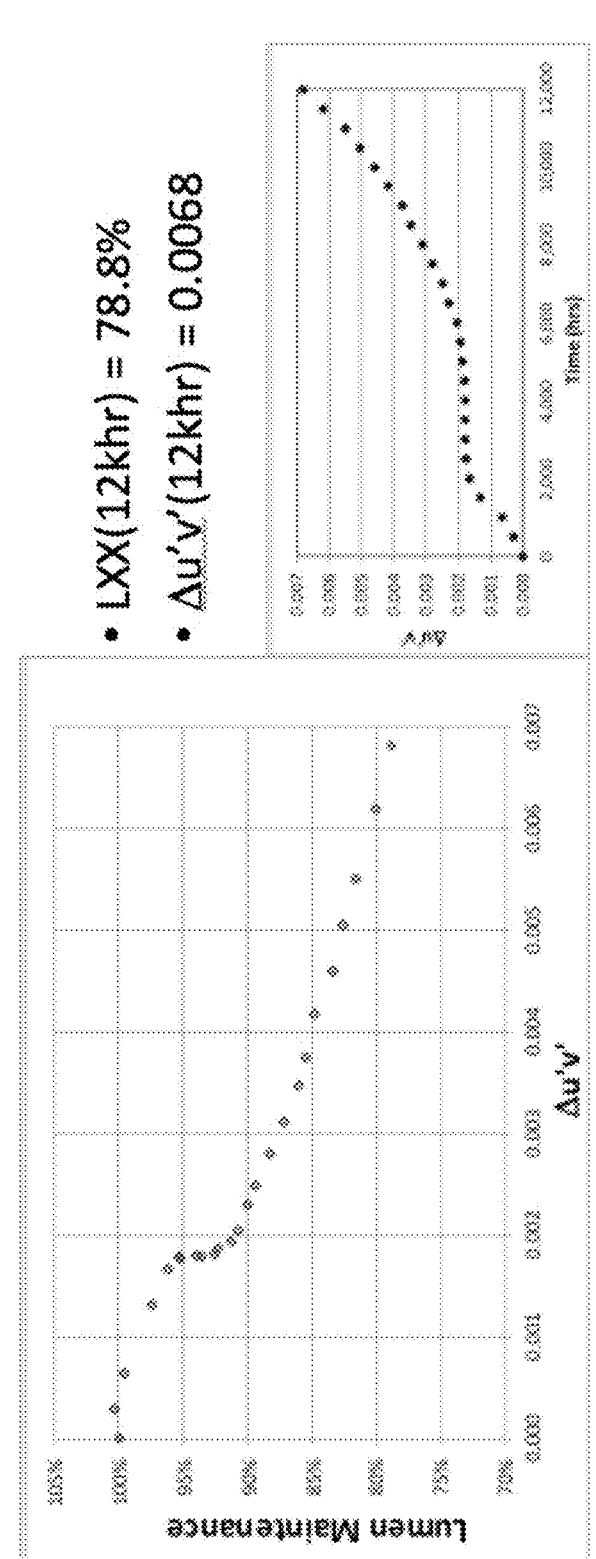
FIG. 2A shows a plot of Lumen Maintenance as a function of $\Delta u'v'$ for an exemplary LED.
FIG. 2B shows a plot of $\Delta u'v'$ as a function of time of operation of the exemplary LED of FIG. 2A.

As can be seen in the example shown in FIG. 2A (Lumen vs Color Shift Failure) and FIG. 2B (Color Shift vs time), by the time lumen maintenance failure is declared at 78% (12,000 hours) the color has already shifted to an unacceptable degreed with Δu'v'=0.0068. For many tasks, this color change (equivalent to 7 MacAdam ellipses) is simply unworkable. In some cases, dramatic color shift (e.g., unacceptable for certain end uses) can occur before Lumen Maintenance reaches 90%.

Figure 2C:
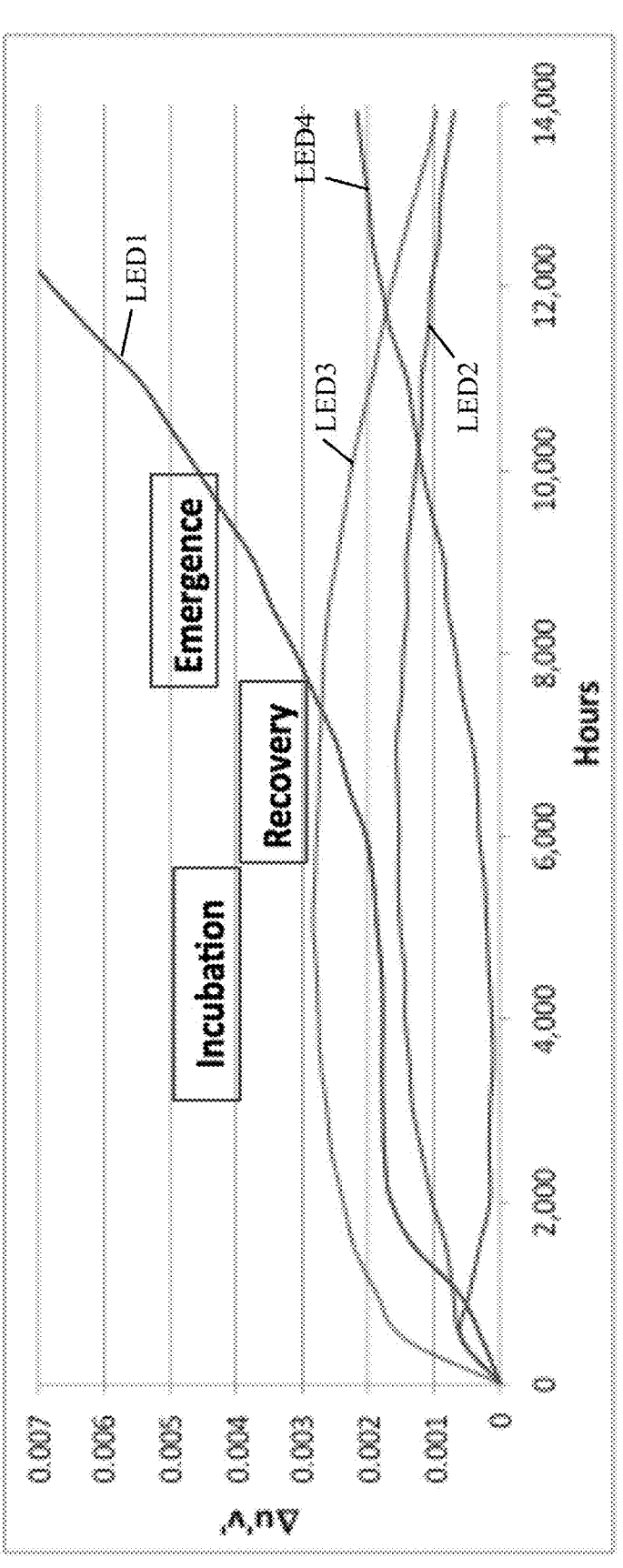
FIG. 2C shows a plot of $\Delta u'v'$ as a function of time for 14,000 hours of operation for four different LEDs.

But looking at a statistically meaningful number of such samples one sees a great deal of variability of color shift behavior. FIG. 2C, for example, shows the time varying color shift of four different LEDs. From this larger sample, one can ascertain three common stages of evolution of the color shift with time: Incubation, Recovery, Emergence.

Incubation is a period of time during which a chromaticity shift ($\Delta u'v'$) is essentially constant. Recovery is a period of time during which the chromaticity shift ($\Delta u'v'$) temporarily decreases or stabilizes. Emergence is a period of time during which the chromaticity shift ($\Delta u'v'$) changes monotonically with time. These stages can be used to generally describe the time evolution of an LED package's color shift throughout its lifetime.

Figure 2D:
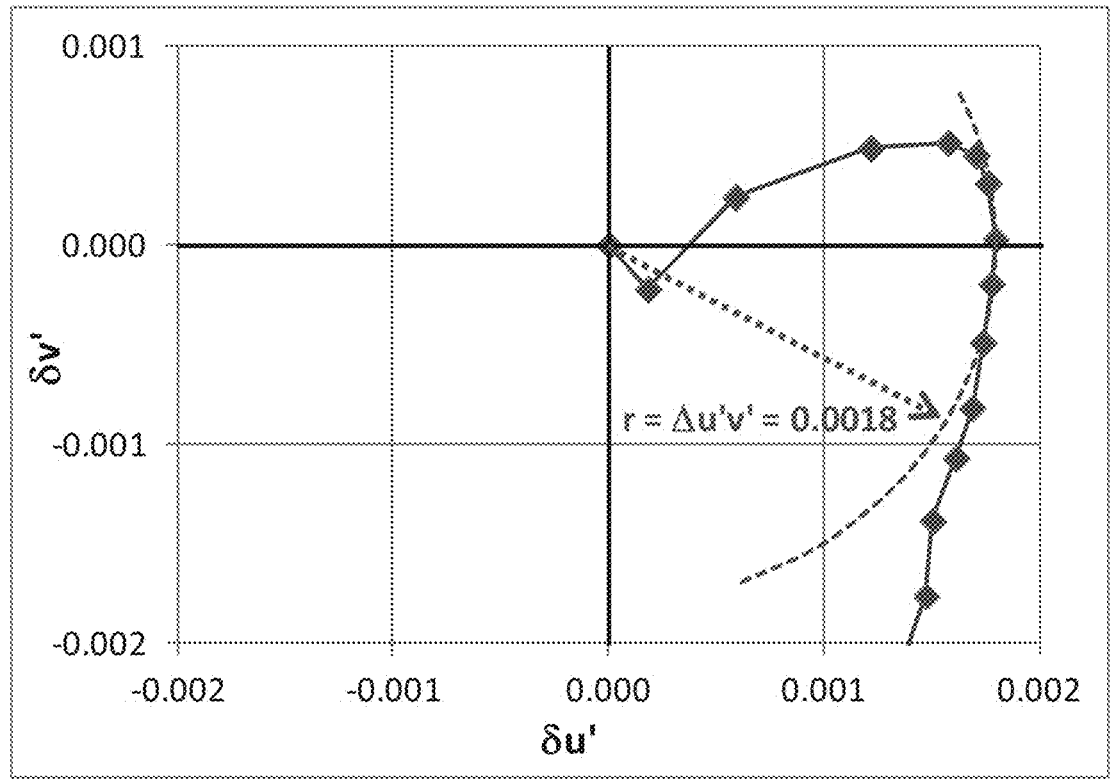
FIG. 2D shows a plot of $\delta v'$ vs. $\delta u'$ over time for an exemplary LED.
Figure 2E:
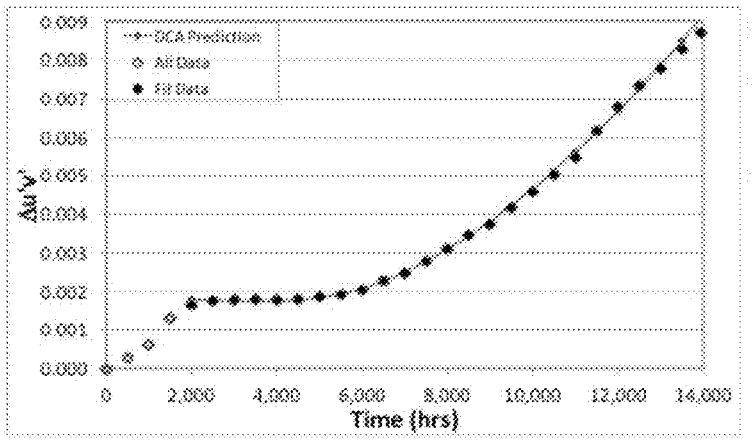
FIG. 2E shows a plot of $\Delta u'v'$ as a function of time of operation for a first example LED, along with values predicted using a DCA model.
Figure 2F:
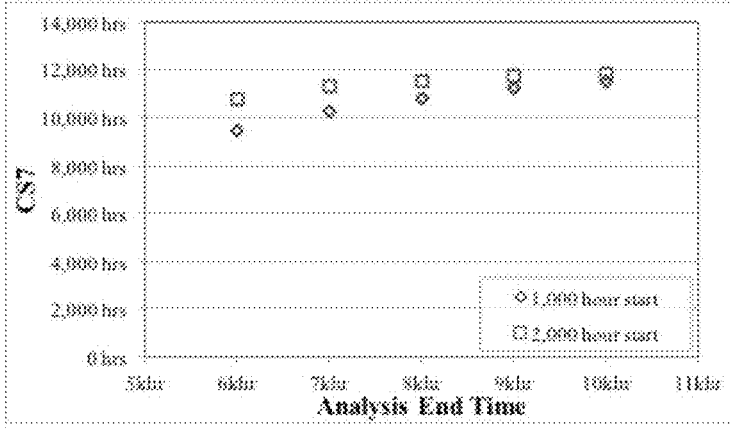
FIG. 2F shows a plot of CS7 as a function of analysis end time as calculated based on a 1,000 hour start and a 2,000 hour start for the first example LED.
Figure 2G:
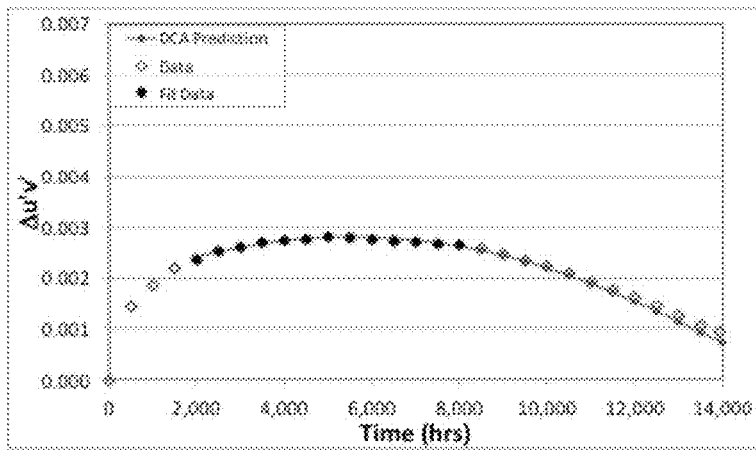
FIG. 2G shows a plot of Δu'v' as a function of time of operation for a second example LED, along with values predicted using a DCA model.
Figure 2H:
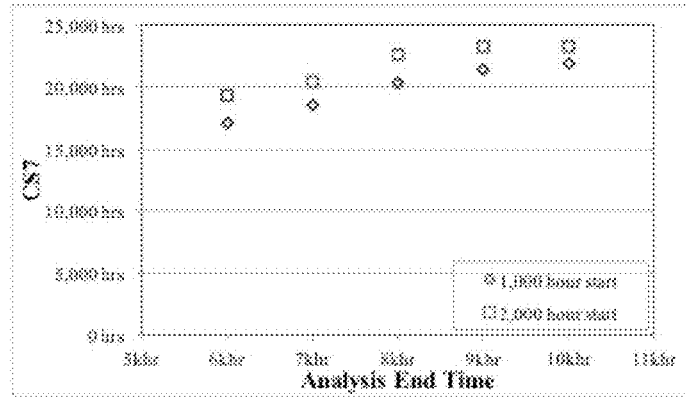
FIG. 2H shows a plot of CS7 as a function of analysis end time as calculated based on a 1,000 hour start and a 2,000 hour start for the second example LED.
Figure 2I:
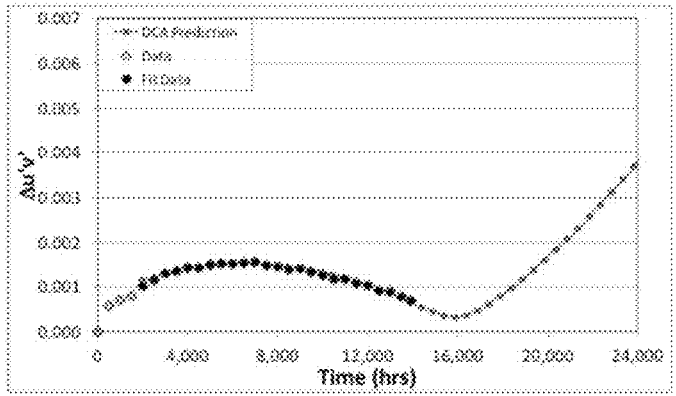
FIG. 2I shows a plot of Δu'v' as a function of time of operation for a third example LED, along with values predicted using a DCA model.
Figure 2J:
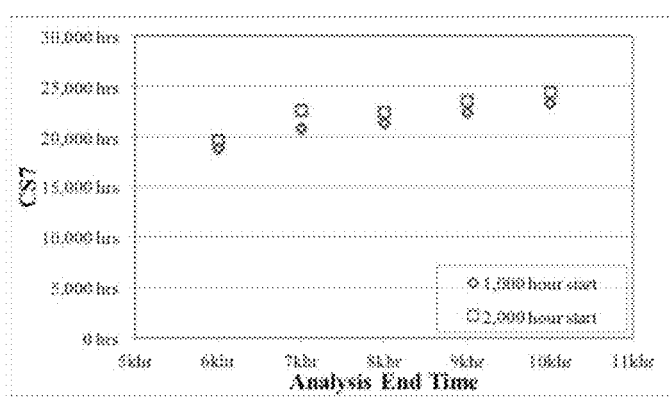
FIG. 2J shows a plot of CS7 as a function of analysis end time as calculated based on a 1,000 hour start and a 2,000 hour start for the third example LED.
Figure 2K:
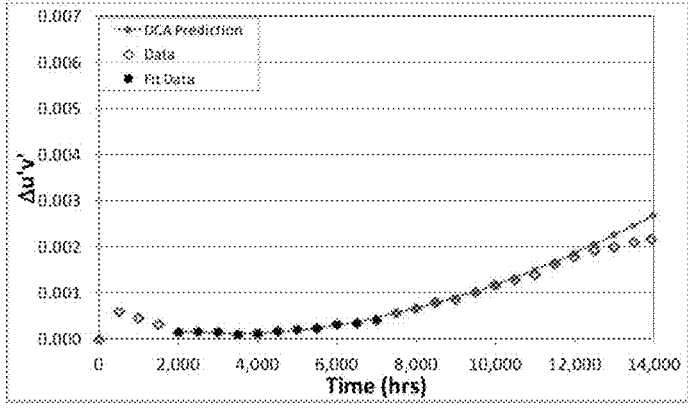
FIG. 2K shows a plot of Δu'v' as a function of time of operation for a fourth example LED, along with values predicted using a DCA model.
Figure 2L:
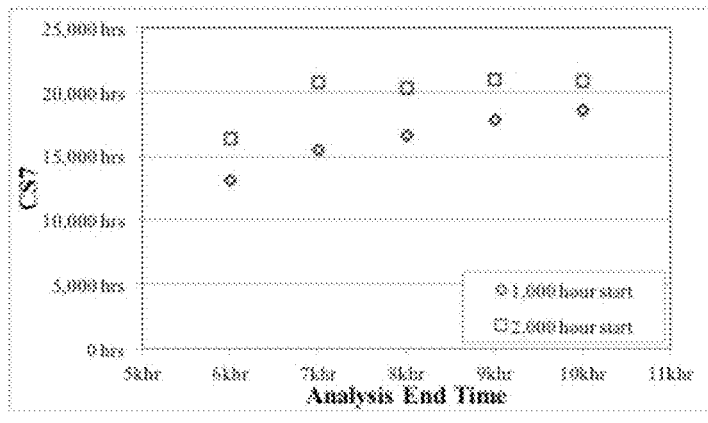
FIG. 2L shows a plot of CS7 as a function of analysis end time as calculated based on a 1,000 hour start and a 2,000 hour start for the fourth example LED.

Referring to FIG. 2D, chromaticity is changing during the incubation stage, but $\Delta u'v'$ remains substantially constant. But after emergence, it is believed that modeling $\Delta u'v'$ will give adequate results if new models can be brought into being. To do so, EQs. (2) defines Differential Chromaticity ($\delta u'^*$, $\delta v'^*$) as the rate of change in relative chromaticity over a given time interval:

$$\delta u'_t *= (\delta u'_{t+\Delta t} - \delta u'_t)/\Delta t, \tag{2}$$
$$\delta v'_t *= (\delta v'_{t+\Delta t} - \delta v'_t)/\Delta t$$

We furthermore establish two 'Principles' involving this Differential Chromaticity:

First Principle of Differential Chromaticity: Differential chromaticity is a linear function of time.

Second Principle of Differential Chromaticity: Keep all data for $t \geq 2,000$ hours.

And using the above, a Differential Chromaticity Algorithm (DCA) is constructed, in accordance with EQs. (3)-(5), as follows:

Calculate relative chromaticities:

$$\delta u'_t = u'_t - u'_0 \tag{3}$$
$$\delta v'_t = v'_t - v'_0$$

Calculate differential chromaticities $$\delta u'_t *= (\delta u'_{t+\Delta t} - \delta u'_t)/\Delta t, \tag{4}$$
$$\delta v'_t *= (\delta v'_{t+\Delta t} - \delta v'_t)/\Delta t$$

Linear fit differential chromaticity data for $t \geq 2,000$ hours. Project relative chromaticities $$\delta u'_{t+Dt} = \delta u'_t + \delta u'_t * \Delta t = \delta u'_t + (a_u t + b_u)\Delta t, \tag{5}$$
$$\delta v'_{t+Dt} = \delta v'_t + \delta v'_t * \Delta t = \delta v'_t + (a_v t + b_v)\Delta t,$$

This means that additional information (from before) may be necessary to understand the system at a given time (at least up to a certain value). Such a situation can be described using one or more delay differential equations.

It can be useful to define a parameter CSn as the time it takes for an LED to exhibit a chromaticity shift ($\Delta u'v'$) of $0.001 \times n$. In other words, "CS4" refers to the time it takes for a LED's color to change so that $\Delta u'v'=0.004$. Similarly, CS7 refers to the time it takes for the color to change so that $\Delta u'v'=0.007$.

Prior to the development of methods to predict color shift of LEDs, LEDs have generally been tested over excessively long periods of time and then measure the change in chromaticity. Critical color shifts may not occur until 12,000 to >20,000 hours corresponding to test times of 16-28 months. This is an impractical amount of time as an LED may require over 2 years of testing before it can be used in a fixture.

The DCA methods used to predict lumen maintenance of LEDs typically require a minimum of 6,000 hours (about 8 months) of testing and LED manufacturers often continue testing until 8,000 hours or more before releasing a new product to the market.

The successful retailing of LEDs for lighting depends in part on the ability to offer guarantees and warranties of performance in both lumen maintenance and color stability. The former warranties are offered, but the latter is almost non-existent. This is due to the relative inability to also predict color shift over time. Ideally, predictive and/or stabilization approaches for color shift can be made to use the same time-scales and data sets as are collected for lumen maintenance.

And indeed, the predictive methods for color shift advantageously used in this application can utilize the same data set as that used for lumen maintenance.

Referring to FIGS. 2E-2L, there is a remarkable fit of measured data to the DCA model, assuming that one has adequately measured the units for a few thousand hours. Specifically, these figures show plots of $\Delta u'v'$ vs. time and CS7 vs analysis end time for four different example LEDs. The "hour start" refers to first data point which is used in the fitting analysis and the "Analysis end time" refers to the last data point used.

It is evident in even these limited examples, that the DCA model is extremely capable: having powerful predictive capabilities; being an extremely efficient noise filter-even poor correlations for differential chromaticity parameters yield reasonably accurate estimates; accurately modeling large time spans of complicated data; and estimates converging as the amount of initial data increases.

Moreover, the DCA model is believed to be package format and material agnostic.

While a particular implementation of the DCA model is described, other implementations are also possible. For example, rather than use numerical derivatives, one can take the first derivative of the quadratic equations to get analytical derivatives. The end result is largely equivalent to the above approach, but for the numerical derivative you invert a $2 \times 2$ matrix and for the analytical derivative you invert a $3 \times 3$ matrix (and discard one parameter).

Other variations to the DCA model, and other approaches to predicting light source color shifts that are not DCA models, are also possible. For example, other coordinate systems may be used. Other coordinate systems that are non-Cartesian color coordinates (e.g., polar coordinates) may be used. Transforming from Cartesian to polar coordinates may provide a noise filtering function, for instance. As a further example, rather than using u', v' values, X, Y, Z tristimulus values can be used to model/measure/predict lumen maintenance as well as color changes. Applying a similar approach to X, Y, Z tristimulus values can be used to model/predict both lumen maintenance and color changes in a single framework as opposed to independent models for lumen maintenance and color shift using independent approaches, as described below.

A Unified Reliability Model for Photometric Parameters

LED light sources are characterized by many different parameters. Among the critical parameters for use in illumination are the luminous flux and the chromaticity. These are treated by the lighting industry as independent parameters. In part this is due to one of the oldest forms of light control which is dimming. With the advent of solid-state lighting, color tuning (chromaticity changing) has also become possible. Thus lighting designers think in terms of controlling luminous flux or chromaticity. The perceived distinct difference between luminous flux (lumens) and chromaticity has become entrained in the collective mind of the lighting industry.

The development of solid-state lighting only served to reinforce this perception. Legacy lighting technologies can be characterized as having a distinct lifetime characterized by catastrophic failure (i.e., no light emission). This is contrasted with LEDs which exhibit a gradual reduction in light output over tens of thousands of hours. As a result, one of the first concerns with use of solid-state lighting was the determination of the end of life. After an extended debate, the consensus of lighting industry was that lifetime would be determined as the point in time when the lumen output of an LED had decreased to 70% of its initial value.

This in turn led to an intense focus on a standard method for estimating LED lifetime based on the lumen maintenance (percentage of luminous flux relative to the initial luminous flux). This was canonized in IES TM-21 which modeled the lumen maintenance of LEDs using an exponential decay.

Legacy lighting technologies exhibited only small changes in chromaticity as they aged. As a result the lighting industry largely ignored issues with chromaticity shift over time. In contrast LEDs were known to exhibit potentially large changes in chromaticity as they aged. At first the problem was largely considered too complicated for a general model that would be applicable over a wide variety of package types and constructions. Although it was known that LEDs could exhibit chromaticity shifts large enough to be considered a failure, the inability to model the behavior over time resulted in chromaticity shift requirements based on products not exceeding a specified threshold in a limited time span-typically 6,000 hours.

The recent development of Differential Chromaticity Analysis (DCA) models has finally allowed chromaticity shift behavior to be modeled over long time spans. This model is being adopted for the first chromaticity shift prediction standard. It is expected that this will result in dual standards for LED performance reliability: one for lumen maintenance and one for chromaticity shift.

The history of the lighting industry and the recent progress in developing a general model for chromaticity shift of LEDs has resulted in the perception that luminous flux and chromaticity are independent parameters. This general perception is reinforced by lighting standards and guidelines that specify a luminous flux and a correlated color temperature (CCT) which is a restricted type of chromaticity specification.

A generalized model that is capable of predicting both lumen maintenance and chromaticity shift in the same theoretical framework would be desirable. Mathematically the models for lumen maintenance and chromaticity shift seem to be incompatible. Lumen maintenance is modeled as an exponential decay in time. Chromaticity shift is modeled using an assumption that the first derivative of each chromaticity coordinate is a linear function of time, e.g., in accordance with EQs. (5).

The effort is further complicated by the generalized perception of luminous flux and chromaticity being independent. Luminous flux is a scalar metric with units of lumens. Chromaticity is a vector (two dimensional) metric that is dimensionless. Simple inspection of the metrics offers no insights or guidance for a unified theoretical framework for predicting LED lifetime. A thorough understanding of the fundamentals of light measurement is critical at this juncture to provide a direction to develop a unified theoretical framework for LED reliability.

Measurement of LED light sources begins with measurement of their spectral power distribution (SPD). The SPD gives information on the spectral power ($\mu$W/nm) for each wavelength. The SPD is a concise if cumbersome definition of LED performance. SPDs are commonly measured over a wavelength range of 380 nm to 780 nm or 360 nm to 830 nm. The latter wavelength range corresponds to the CIE definition for the full range of visible light. The former reduced wavelength range is sometimes used as the eye response to light between 360 nm to 380 nm and 780 nm to 830 nm is very low and neglecting the information at these extremes makes little to no difference in the value of calculated parameters.

The eye's sensitivity to light, also referred to as photopic response, varies with wavelength. This information is summarized in the photopic response curve. The photopic response curve has units of lumens/W and provides a means of converting an SPD into luminous flux.

$$\Phi = \int I(\lambda)V(\lambda)d\lambda. \tag{6}$$

In EQ. (6), $\phi$ is the flux, measured in lumens; $I(\lambda)$ is the spectral power distribution, measured in W/nm; and $V(\lambda)$ is the photopic response, measured in lm/W. Further, the integration is typically carried out using the limits of 380 nm and 780 nm or 360 nm and 830 nm, as discussed above.

Chromaticity calculations are based on numerous studies of the color receptors in the human eye-cone cells. Individuals with normal color vision have three different photoreceptors for different wavelengths of light. These are termed L, M, S cones and may loosely be thought of as responding to red, green and blue light, respectively. A fourth class of photoreceptors is called rod cells is responsible for vision under low levels of lighting, however, it is believed that rod cells do not contribute to color perception.

Normal human color vision is trichromatic (based on three color primaries). Chromaticity calculations are based on this and use three different response spectra call tristimulus response curves. The tristimulus response curves were based on studies of normal human color vision.

Calculating chromaticity involves calculating tristimulus (X, Y, Z) values from the three different tristimulus response curves.

$$X = \int \bar{x}(\lambda)I(\lambda)d\lambda, \tag{7}$$

$$Y = \int \bar{y}(\lambda)I(\lambda)d\lambda,$$

$$Z = \int \bar{z}(\lambda)I(\lambda)d\lambda.$$

In EQs. (7), $\bar{x}(\lambda)$ is the tristimulus x response, $\bar{y}(\lambda)$ is the tristimulus y response, and $\bar{z}(\lambda)$ is the tristimulus z response.

Translating the three dimensional tristimulus parameters into two dimensional chromaticity is achieved by normalization. The normalization includes dividing each tristimulus value by the sum of all three tristimulus values.

$$x = \frac{x}{X+Y+Z},$$ (8)
$$y = \frac{Y}{X+Y+Z},$$
$$z = \frac{Z}{X+Y+Z}$$

This normalization, in accordance with EQs. (8), means that the normalized tristimulus values satisfy x+y+z=1, so specifying any two parameters means the third can be calculated, and thus is known. This process is the basis for all chromaticity diagrams. By convention x and y are specified. If needed, z can be calculated from z=1−x−y.

Generally, distances in the xy chromaticity diagram correlate poorly with perceptual differences. Linear transformations of x and y result in chromaticity diagrams with a better correlation between distance and perceived color difference. The current preferred chromaticity diagram is the u'v' chromaticity diagram, in accordance with EQs. (9).

$$u' = \frac{4x}{-2x+12y+3} = \frac{4X}{X+15Y+3Z},$$ (9)
$$v' = \frac{9y}{-2x+12y+3} = \frac{9Y}{X+15Y+3Z}.$$

On the surface this provides no obvious route to a unified theoretical framework for predicting lumen maintenance and chromaticity shift. The missing critical piece of information lies in the selection of the tristimulus response functions.

For technical reasons all three tristimulus response functions were chosen so that each tristimulus value would always be positive. The X and Z tristimulus response functions were chosen to lie on the alychne—the locus of points which have zero luminance. This meant that the luminous efficiencies of the X and Z tristimulus values would always equal zero and that the luminous efficiency of the remaining Y primary stimulus could be set to unity. In other words, the Y tristimulus response function became equal to the photopic response function from EQ. (6), i.e., $\bar{y}(\lambda) \equiv V(\lambda)$.

Since the chromaticity values (x, y, z) are scaled to unity, they are independent of the magnitude of the original tristimulus values (X, Y, Z). Therefore multiplying the chromaticity coordinates by the luminous flux creates a set of pseudo tristimulus values that each contain information on the chromaticity coordinates and the luminous flux.

$$X^p = \Phi x,$$ (10)
$$Y^p = \Phi y,$$
$$Z^p = \Phi z$$

In EQs. (10), $\phi$ is the luminous flux, and z=1−x−y.

In this new coordinate system $Y^p$ is exactly equal to the luminous flux and can be modeled using an exponential decay, so that $$Y^p(t) = Ae^{-\alpha t}.$$ (11)

EQ. (11) is an analog of the exponential decay model used to predict lumen maintenance of an LED. The only difference is that in this framework $Y^p$ is the actual luminous flux, so a simple normalization step yields results identical to IES TM-21 (i.e., dividing by the initial luminous flux).

This allows the other two pseudo tristimulus values to be modeled according to the DCA model. DCA assumes that the first derivative of chromaticity coordinates is a linear function of time, in accordance with EQs. (5). In other words, in accordance with EQs. (5'), $$\frac{dX^p}{dt} = a_X t + b_X,$$ (5')
$$\frac{dZ^p}{dt} = a_Z t + b_Z$$

Attempts to model all three tristimulus values or chromaticity values using an exponential decay model may only be reasonable for very long time frames. The small values of the decay rate mean that the exponential decays are essentially linear models. A Taylor series expansion of an exponential decay with respect to time is given by EQ. (13):

$$e^{-\alpha t} = 1 - \frac{\alpha t}{1!} + \frac{(\alpha t)^2}{2!} - \frac{(\alpha t)^3}{3!} + \frac{(\alpha t)^4}{4!} - \cdots.$$ (12)

TM-21 analysis of LED reliability gives $\alpha \sim 10^{-6}$ which means that there is little significant difference between an exponential function and a linear approximation over any reasonable time period (i.e. <10,000 hours) for reliability measurements.

Any efforts to model behavior of chromaticity coordinates over time as a linear or nearly linear model will fail as simple inspection shows that the behavior of chromaticity with respect to time is best approximated by a parabolic equation.

Thus assuming the first derivative of $X^p$ and $Z^p$ are linear with respect to time, in accordance with EQs. (5'), which matches the assumptions of DCA, in accordance with EQs. (5), completes the theoretical framework.

In this new theoretical framework, the luminous flux will follow the same exponential decay model used in IES TM-21. The remaining pseudo tristimulus values are modeled as non-linear (e.g., parabolic) functions. In this theoretical framework the primary outputs are pseudo tristimulus values. Normalizing all three pseudo tristimulus values yields projected chromaticity values which may then be converted to whatever chromaticity coordinate system is desired, as shown in EQs. (13).

$$X^p(t) = X^p(0) + (a_X t + b_X)\Delta t,$$ (13)
$$Y^p(t) = Ae^{-\alpha t},$$
$$Z^p(t) = Z^p(0) + (a_Z t + b_Z)\Delta t$$

Calculation of lumen maintenance becomes a matter of normalizing the projected luminous flux by the initial luminous flux. Projecting chromaticity is only slightly more complicated, as all three pseudo tristimulus values must be projected. However calculating the projected chromaticity values only requires substitution into the equations (9) used to calculate chromaticity coordinates.

Moreover, while the models above are described for a single LED package, color shift models can be applied to other LED systems as well. For example, models can be used to predict color shifts of LED bulbs, LED luminaries, and even systems composed of multiple LED bulbs and/or LED luminaires.

Acceleration of LED Package Aging and Color Stability Evolution

Without wishing to be bound by theory, it is believed that the chromaticity change can occur due to a variety of changes that occur in the phosphor-containing material, the interface between the phosphor-containing material and the LED die, and/or other components of the support structure as well as the more complex optics of a more complex unit (lamp, bulb, fixture, luminaire, and even a system installed in an architectural environment (inside or outside). For example, color shifts can occur due to changes in the distribution of phosphor particles in the phosphor-containing material. Alternatively, or additionally, color shifts can occur due to changes in the light absorption properties of the binder that occur during prolonged exposure to short wavelength light (e.g., light emitted from the LED die). For instance, certain clear polymers are known to take on a yellow appearance upon prolonged exposure to blue, violet, and/or ultraviolet light. Delamination of the phosphor-containing material from the substrate, rim, and/or LED die can also result in changes in the color of the LED.

It is further believed that some of the color change can be attributed to changes in other components of the LED that interact with the light, such as the substrate and/or rim materials. For example, in some LED's, a white plastic material is used as the substrate layer that supports the LED. The rim can be formed from similar material. This material can absorb increasing amounts of blue light as it ages, taking on a yellow hue. Because this material reflects light from the LED die and the phosphor-containing material, changes in its spectral reflectivity can result in color changes to the LED.

As some white LEDs use more than one phosphor material, some color changes can result from changes between the interaction strengths of each phosphor material and the LED light. In some cases, the light emitted by one phosphor material can be absorbed by a second phosphor material and re-emitted as a different wavelength. In these devices, changes in the optical interaction between the two (or more) different phosphor materials can result in a noticeable color shift. These types of aging mechanisms typically result in green or red color shifts.

Accordingly, it is believed that the color shift (e.g., in the initial phase, in particular) can be reduced by adopting certain steps during or after the manufacture of an LED to reduce physical and/or chemical changes in the phosphor-containing material, the interface between the phosphor-containing material, and/or other components of the LED that occur during prolonged exposure of those components to light and/or heat during the LED's operation. In some cases, the color stabilization (i.e., predictability of color shift, either by reduction of the color shift or advancement of the color shift pattern to a regime where it is predictable) can be caused by accelerating the aging effects that cause the color shift over the initial few thousand hours of LED use. Alternatively, in other cases, the color is stabilized by reducing this color shift. Besides absolute (i.e., constant) stabilization, more generally this aging is intended to get to the point of predictability while simultaneously acquiring the data to make the prediction in the first place.

For example, in some embodiments, LED components (e.g., the phosphor-containing material, the rim, and/or the substrate) can be exposed to intense light during or after the manufacture of the LED. For example, the fully assembled LED package can be exposed to light for reducing the color shift. UV and/or short wavelength (e.g., violet and/or blue) light can be used. Exposure can be continuous or pulsed.

Narrowband or broadband light can be used. The light can be coherent (e.g., from a laser) or incoherent. Because of the role of photo-oxidation in these processes, exposure times can vary (e.g., exposure time can be on the order of minutes, hours, or days). In some embodiments, the LED can be electrically-driven in a post-assembly step in order to reduce the color shift once the LED is distributed to the end user.

Alternatively, or additionally, LED components (e.g., the phosphor-containing material, the rim, and/or the substrate, individually or packaged together) can be exposed to heat during manufacture of the LED. For example, LED components can be exposed to temperatures at or in excess of expected operational temperatures of the LED. In some embodiments, LED components are exposed to temperatures of 100° C. or more (e.g., 120° C. or more, 130° C. or more, 140° C. or more, 150° C. or more) during or after manufacture. Generally, the temperature and duration of exposure should not exceed exposures that are damaging to the exposed components.

In implementations where the components are exposed to both light and heat, the exposures may be simultaneous, overlapping, sequential, or at entirely different times.

Heat exposure can be applied by placing the components in an oven, exposure the heating radiation (e.g., IR radiation), or by some other means. Heat exposure times can vary (e.g., exposure time can be on the order of minutes, hours, or days). More generally, the LED components can be heated by conduction, convention, or radiation, or by any combination of these methods.

In some embodiments, in addition or alternatively to light and/or heat, the LED package may be exposed to one or more chemical reagents to promote color stability. Exposure to oxidizing agents during or post manufacturing, for example, may accelerate chemical reactions that occur during initial use of the LED. Pure oxygen, air, or other oxidizing agents can be used. In certain embodiments, water may be used (e.g., by exposure to a humid environment). Chemical reagents may be provided in a hyperbaric environment. In some cases, chemical reagents are provided simultaneously with radiation (e.g., light) and/or heat.

In certain implementations, the LED is exposed to a reactive oxygen atmosphere. For this, one can heat/irradiate under a high oxygen partial pressure environment or use exposure to an oxygen plasma.

Figure 3A:
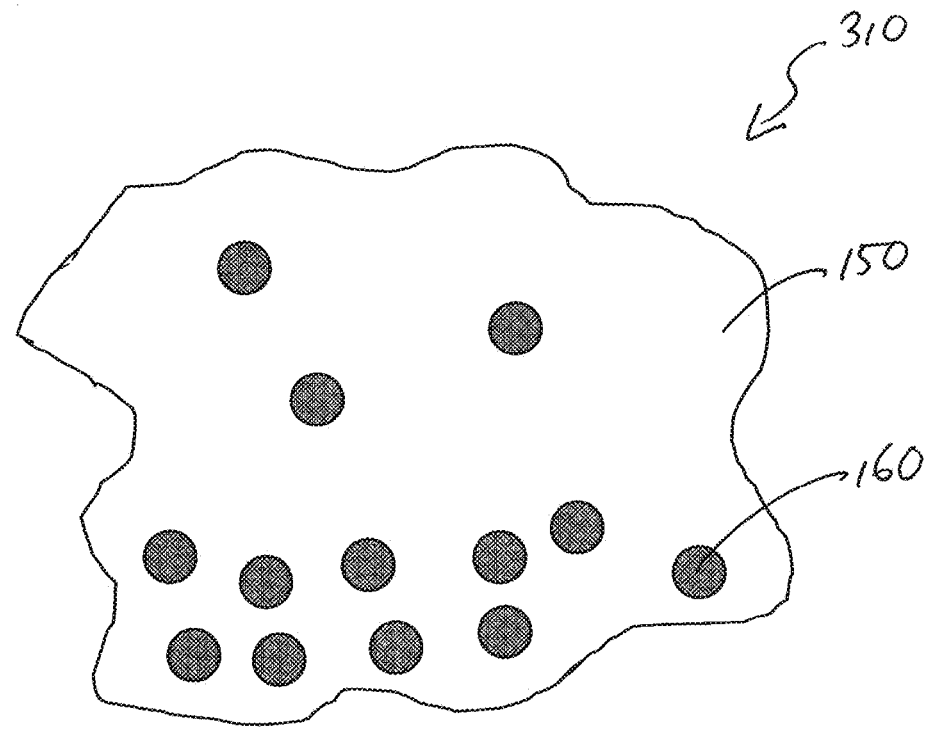
FIG. 3A shows an embodiment of a phosphor-containing material formed from a dispersion of phosphor particles in a binder, where the phosphor particles are inhomogeneously dispersed through the binder.

As noted above, it is believed that in certain cases at least some of the initial color shift can be attributed to a redistribution or destabilization of phosphor particles 160 in binder 150. For example, referring to FIG. 3A, as shown in phosphor-containing material 310, phosphor particles 160 can settle on one side of the layer, resulting in a higher particle density either closer to or further from the LED die than would occur for a homogeneous distribution. In some implementations, phosphor particle redistribution can be accelerated during manufacture of an LED. Such a process may reduce the degree of phosphor particle redistribution during the initial phase of the LED lifetime, for example.

In some embodiments, phosphor redistribution can be effected by an agitation process. For example, the phosphor-containing material can be ultrasonically agitated at some stage during or after manufacture. For instance, ultrasound can be used as part of an aging/stabilization treatment after the LED package is assembled.

Alternatively, or additionally to ultrasonic agitation, the phosphor-containing material can be centrifuged or other mechanical energy inputs to effect phosphor particle redistribution.

Lower frequency sound (mechanical acoustic impulses) may also be used. Generally, any frequencies can be used that work on the larger scale structures of the heterogeneous material that includes phosphors, binders, and other material. For example, this energy might influence crack structures, localized annealing, and other mechanical-structural properties over larger scales of the material.

In certain embodiments, phosphor particle density can be redistributed using electrophoresis.

In some embodiments, the optical properties of the phosphor-containing material can be change by dispersing additional scattering centers in the binder. For example, referring to FIG. 3B, in some embodiments, scattering centers 325 are included with phosphor particles 160 in binder 150 to provide phosphor-containing material 320. Scattering centers 325 can reduce exposure of the substrate material and/or rim material to light from the LED die by increasing scattering of light out of the LED. Accordingly, scattering centers can reduce or slow photochemical or mechanical changes in the substrate and rim materials that can cause color changes.

In some cases, scattering centers 325 can be anisotropic particles, presenting angular facets for scattering incident light at large scattering angles. For example, carbon nanotubes, silicon carbide, silk or polymer filaments can be used. Graphite or graphene particles can be used. Graphene is particularly attractive as it can be highly transparent, has considerable thermal stability, and strong mechanical integrity. Modern spinning techniques can produce so-called microfibers (<1 Denier fibers or ~<10 um diameter). Those give enormous surface areas which can provide a lot of reinforcement against physical changes. It is also approaching the wavelength of light so we can get some amazing scattering as well. Alternatively, sufficiently small filaments can be used so that they have a minimal optical effect (e.g., particles that are sufficiently smaller than the wavelength of light and result in little or no scattering). Particles should be photostable.

Use of high specific surface area particles (e.g., high surface area to volume—graphene, carbon nanotubes, micro/nano fibers) can significantly strengthen materials against physical changes. The high surface area per volume provides for increased surface interactions which reinforce the bulk material against dimensional changes and cracking. In addition, if sized appropriately, high specific surface area materials may also act as highly efficient scattering centers which increase the degree of interaction between light emitted by the LED chip and any phosphor material(s).

Additives to the phosphor-containing material, such as anisotropic particles 325, can also be used to physically stabilize the phosphor particle distribution in binder 150. For instance, elongated particles can form a network that inhibits movement of phosphor particles in the binder.

Figure 3B:
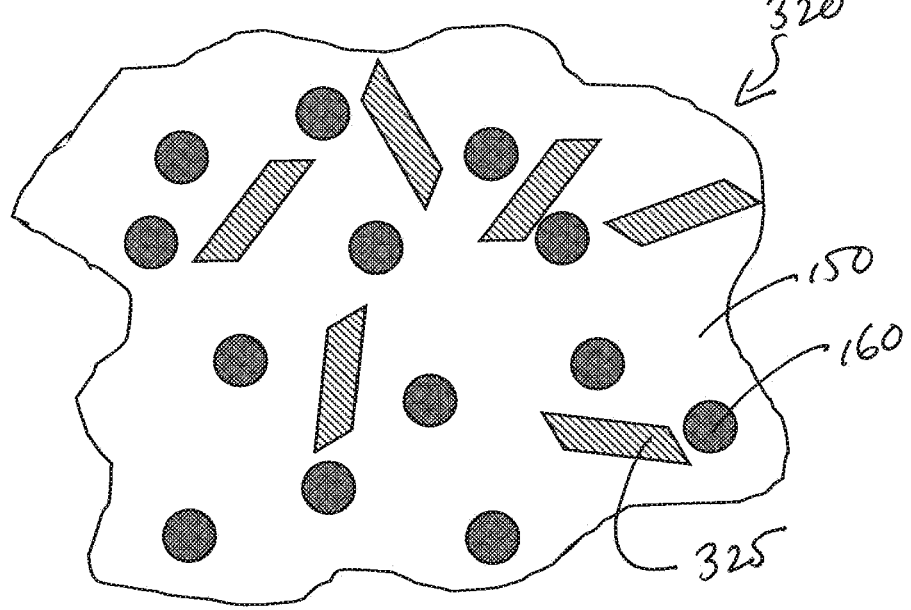
FIG. 3B shows an embodiment of a phosphor-containing material formed from a dispersion of phosphor particles in a binder along with additional scattering centers.
Figure 3C:
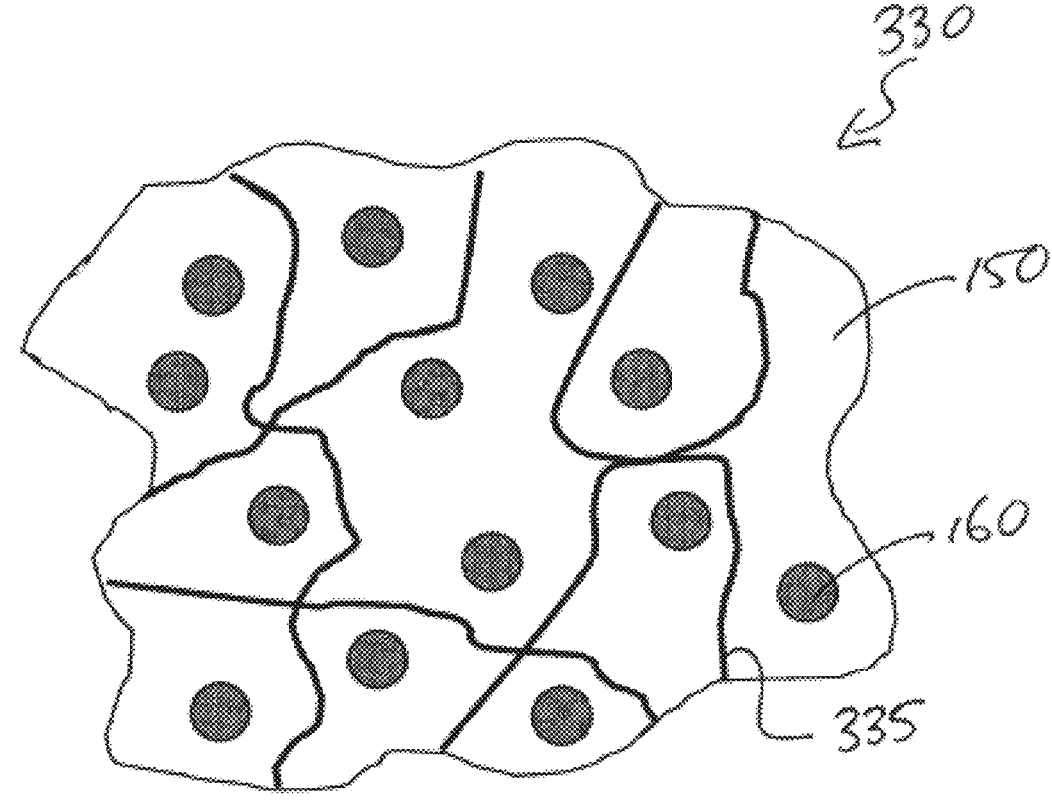
FIG. 3C shows an embodiment of a phosphor-containing material formed from a dispersion of phosphor particles in a binder with cross-linked polymer network.

Referring to FIG. 3C, in some embodiments, a phosphor-containing material 330 includes a cross-linked polymer network 335 to mechanically stabilize the phosphor-particle distribution. For example, multi-functional acrylate polymers can be included in the binder to provide a cross-linked polymer network. Polyacrylamides can also be used to provide a cross-linked polymer network.

In the foregoing materials shown in FIGS. 3B and 3C, additives to the phosphor-containing material are included to preserve a homogeneous distribution of the phosphor particles through mechanical stabilization of the phosphor particle distribution. However, in some embodiments, additives can be included to chemically stabilize the phosphor particle distribution. For example, an additive which chemically binds to phosphor particles may be provided to create a network of phosphor particles, reducing movement of phosphor particles in the binder (and corresponding reducing phosphor particle density changes).

Surface treatments to increase adhesion between components of the LED can also reduce lifetime color shifts, e.g., by reducing delamination of components such as delamination of the phosphor-containing material from the substrate, LED die, and/or rim. For example, roughening of the substrate surface can promote adhesion of the phosphor-containing material to the substrate. Surface roughening can be performed by surface etching (e.g., by plasma, RIE, or some other etchant). In some embodiments, one or more adhesion promotion layers, e.g., primers, can be applied to one or more surfaces of LED components. Possible adhesion promoters include thiol, acrylate, and hydroxyl polymers.

As described above in regards to the DCA model, it is possible to use a mathematical model to predict the lifetime color shift for a white LED. Other approaches are also possible. For example, it is possible to fit (e.g., parametrically) a curve to one or more of the phases of a variety of sample LED's in order to predict the behavior of similar LEDs. For example, a linear or geometric (e.g., quadratic or higher order function) can be fit to the $\Delta u'v'$ curve after the incubation phase for a LED sample. Best fit parameters can be used, subsequently, to predict the color changes of similar LEDs during the same phase of their lifetimes.

It is also possible to predict expected color shift and/or other operational parameters based on a look up table determined (e.g., solely determined) on statistical data obtained from respective observation during operation of corresponding reference systems. Such predictions may be formed without respective model descriptions.

Being able to predict the lifetime color shift behavior of a white LED can allow users to compensate, accommodate, and/or take advantage in other ways the anticipated shift. For example, in some implementations, it is possible to combine multiple white LEDs with different color aging effects in a manner such that the color aging of certain LEDs compensates for the color aging of other LEDs included in the combination.

Figure 4:
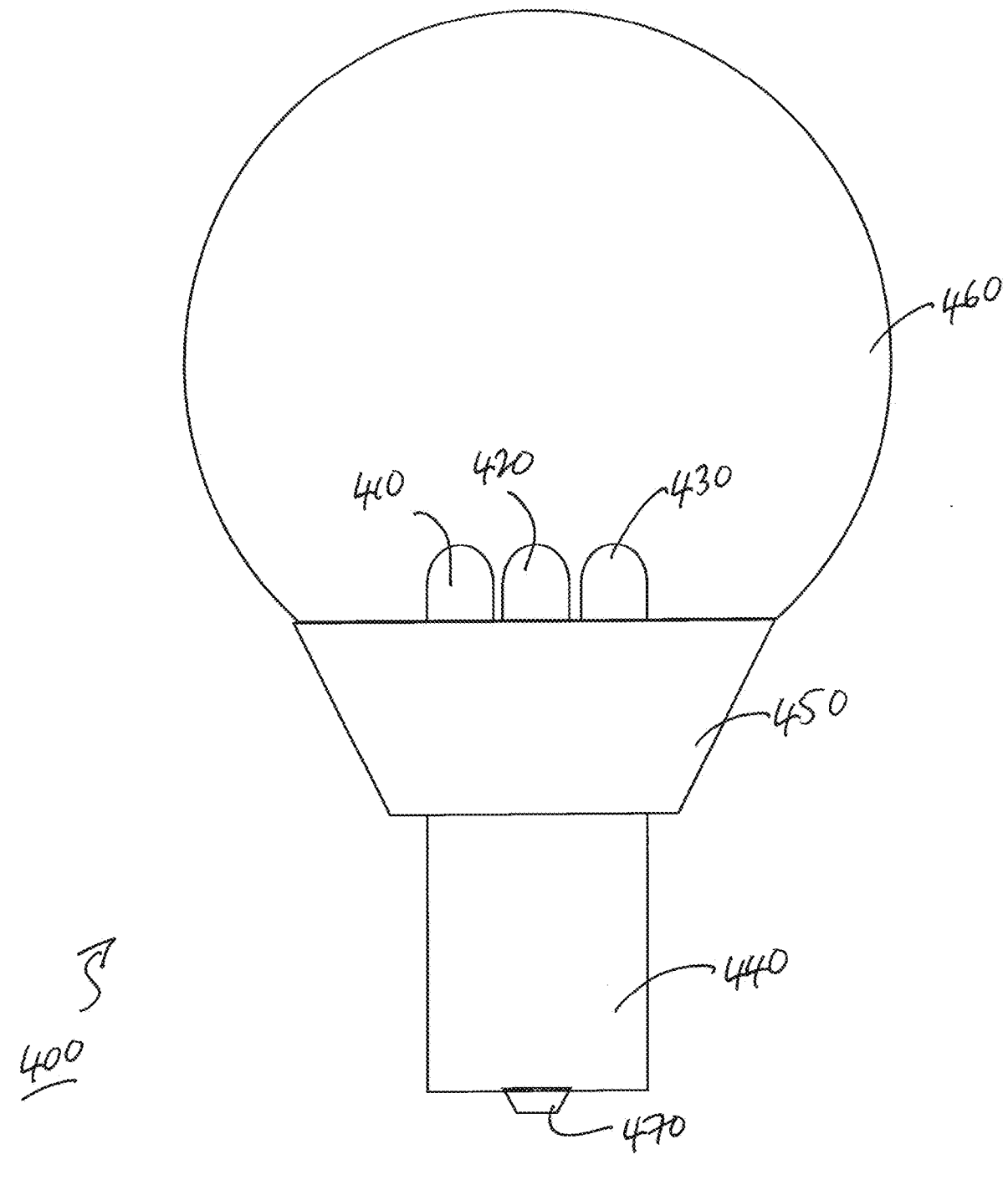
FIG. 4 is a schematic diagram of a bulb containing three white LEDs.

For example, referring to FIG. 4, a bulb 400 includes three different white LEDs 410, 420, and 430. The bulb also includes a screw connector 440 with an electrical contact 470, a platform 450 supporting the LEDs and connecting the LEDs and the base, and a transparent or translucent bulb cover 460. While bulb 400 is an A-type bulb, more generally the use of multiple LEDs with different color aging effects can be implemented in any form factor, including standard bulbs or custom fixtures.

Each of LEDs 410, 420, and 430 has a different white point and different predicted lifetime color shifts such that the color of the combined output from the three LEDs remains within a specified range (e.g., $\Delta u'v'$ remains within 0.004 of the initial white point, such as within 0.002 or less, within 0.001 or less, within 0.0005 or less, within 0.0002 or less, within 0.0001) for a specified lifetime (e.g., 15 khrs or more, 20 khrs or more, 25 khrs or more, 30 khrs or more, such as up to 40 khrs).

In some implementations, combinations of three LEDs are selected because their individual predicted color shifts can substantially cancel each other and as such can be used to maintain a defined white point on the Planckian locus within a narrow tolerance. In other words, monitoring or feedback of the bulbs light output can become redundant to maintain the bulb color within spec. Depending on the implementation, such combinations may still require drive current adjustments per LED based on cumulative operating time per LED and/or instant operating temperature of the LEDs, for example. Since this method does not require active feedback (e.g., by monitoring color shifts using integrated color (e.g., spectral) sensors), the resulting color stable product is less complex and less expensive to manufacture.

Generally, implementations include two or more LEDs. For example, first and second LEDs that are configured to output first light having a first color shift at a number of operating hours and a second LED configured to output second light having a second color shift at the same number of operating hours. When the second color shift is different from the first color shift, the first and second color shifts can compensate each other partially or fully. Note that the color shifts can be expressed as two or three-dimensional vectors as described herein. As such the first and second LEDs can be selected during assembly of the system based on the first and second color shifts to provide combined light, that is a combination of the first and second light, that has a combined color shift that is less than the smaller of the first and second color shifts at the same operating hours. Depending on the LEDs, the system can exhibit a combined color shift that continues to be less than the individual first and second color shifts for a range of operating hours extending beyond. This range can be 8000, 10000, 15000, 20000, 30000, 50000, 75000, 100,000 or more hours. The longer the first and second color shifts exceed the combined color shift, the better the pairing of the first and second LEDs in terms of color stability. Likewise, a sooner onset of full or partial compensation of the first and second color shifts in the combined color shift is of interest. Depending on the system, such compensation may occur as early as a right from initial commissioning or after a few thousand hours from initial commissioning, for example after 8000 hours.

In some implementations, first and second LEDs may be selected during assembly of the system additionally based on intended operating conditions of the system, for example, to account for dimming of the LEDs over time to compensated for lumen output depreciation from aging of the LEDs during operation. As such the intended operating conditions of the system can include cumulative weighted dimming levels of the first and second LEDs. Compared to nominal operating conditions, dimming can slow down aging of the LEDs and the cumulative effect may be captured by considering respective integrated dimmed light outputs of corresponding LEDs.

In some implementations combinations of LEDs can be used which have the same or at least very similar color shifts but different color points. By using LEDs with different color points, the required white point on the black body line is the result of the different LEDs. When this color point is changing during lifetime, the drive currents of the individual LEDs are varied to maintain the resulting color point on the black body line. The drive currents supplied to the LEDs having different color points can be varied using current varying means. Examples of current varying means are variable power sources, which in turn include one or more of variable current sources, and variable voltage source. Such variable power sources are coupled with the LEDs having different color points in an appropriate manner, so the drive currents supplied to each of the LEDs can be varied independently, for instance.

Alternatively, in some embodiments, feedback is used to control the relative current between the three LEDs in order to maintain the bulb's color within spec. For example, the bulb can include a current sensor to monitor the current to each of LED and a temperature sensor to monitor a temperature of each LED (e.g., of the substrate or other component of each LED). Based on relative variations between the current and temperature for each LED, the bulb can increase the relative current to individual LEDs to vary their relative brightness which, in turn, compensates for a relative color shift between them. More generally, other feedback modes can be used. For instance, in some embodiments, a spectral sensor is used to monitor color changes and the brightness of each LED is adjusted to reduce sensed changes to the white point of the bulb.

Feedforward modes, e.g., based on input from one or more sensors and information about the predicted color variation of each LED, are also possible. Implementations of feedback and feedforward models are described, for example, in U.S. Pat. No. 7,893,631, WO2008/139369, and U.S. Pat. No. 6,441,558. The entire contents of each of these references is hereby incorporated by reference (in case of conflict, the present disclosure controls).

Figure 5:
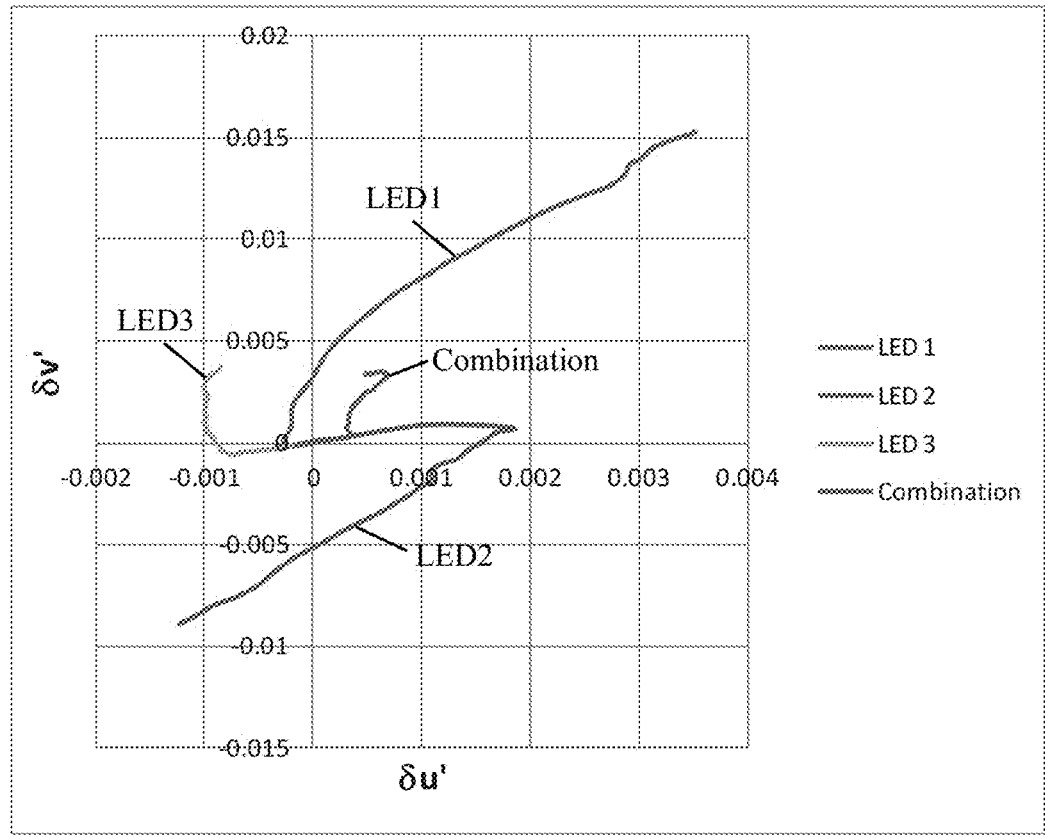
FIG. 5 shows a plot of δv' vs δu' for an example light source combining three LEDs to reduce color variation in overall output.

FIG. 5 shows a plot of $\delta v'$ vs $\delta u'$ for an example light source combining three LEDs to reduce color variation in overall output. This example is based on straight averaging with no weighting of the output of individual LEDs.

Of course, while bulb 400 includes three LEDs, this is purely illustrative. More generally, bulbs or fixtures can include any number of LEDs.

Accurate prediction of LEDs color shifts also allows one to sort (i.e., bin) LEDs according to their color shift (e.g., in addition to their starting color point). This can allow LED manufacturers to confidently provide their customers with color aging information, just as they provide lumen maintenance information.

While the foregoing embodiments relate to phosphor-containing white LEDs containing a LED chip, more generally, the concepts disclosed herein can be applied to other light sources too. For example, the concepts can be applied to other phosphor-containing light sources, such as packages combining phosphors and laser diodes or other nano-scale light sources and hybrid light sources (e.g., packages including a white LED and a red LED). Organic LED (OLED)-based light sources can also be used. Moreover, the concepts can be applied to light sources at the package, bulb, luminaire, or system level. Certain concepts (e.g., DCA modelling) can be applied to non-phosphor based light sources, such as high intensity discharge lamps or other sources that may be subject to color changes over their lifetime.

A number of embodiments are described. Other embodiments are in the following claims.

The invention claimed is:

1. A system, comprising:
   two or more phosphor-containing white LEDs configured to emit white light during operation of the system, each of the white LEDs having a corresponding predetermined color shift over a period of operation of the system,
   wherein the white light emitted by the two or more LEDs combined has a combined color shift (Δu'v'), over the period of operation of the system, that is both less than 0.007 and less than at least one of the LEDs' color shifts,
      the period of operation being a predetermined number of hours that commences after 1,000 hours or more of operation of the system and before 200,000 hours of operation of the system.

2. The system of claim 1, wherein the predetermined number of hours is 8,000 hours.

3. The system of claim 1, wherein the combined color shift (Δu'v') over the operating time is less than 0.006.

4. The system of claim 1, wherein the system is a light bulb comprising the two or more phosphor-containing white LEDs.

5. The system of claim 1, wherein the system is a luminaire comprising the two or more phosphor-containing white LEDs.

6. The system of claim 1, comprising multiple bulbs and/or luminaires which include the two or more phosphor-containing white LEDs.

7. The system of claim 1, comprising a current varying module configured to selectively vary a relative current to each of the two or more phosphor-containing white LEDs in order to vary their relative brightness.

8. The system of claim 7, wherein the current varying module comprises a feedback loop or a feedforward loop based on which the current varying module varies the relative current to each of the two or more phosphor-containing white LEDs.

9. The system of claim 8, wherein the feedback loop comprises at least one sensor associated with the two or more phosphor-containing white LEDs, the at least one sensor configured to produce feedback information based on which the feedback loop is operated.

10. The system of claim 9, wherein the at least one sensor comprises a current sensor.

11. The system of claim 10, wherein the at least one sensor comprises a spectral sensor.

12. The system of claim 9, wherein the at least one sensor comprises a temperature sensor.

13. The system of claim 1, wherein the two or more phosphor-containing white LEDs are combined based on a predicted color shift for each of the LEDs.

14. The system of claim 13, wherein the color shift is predicted based on a measurement of the two or more phosphor-containing white LEDs' actual color shifts over at least 1,000 hours of operation.

15. The system of claim 14, wherein the color shift is predicted based on a measurement of an actual color shift of sample phosphor-containing white LEDs of the kinds of the two or more phosphor-containing white LEDs over at least 2,000 hours but less than 8,000 hours of operation.

16. The system of claim 13, wherein the predicted color shift is predicted based on a model.

17. The system of claim 16, wherein the model includes a Differential Chromaticity Algorithm (DCA) model, in which chromaticity shifts depend linearly on time.

18. The system of claim 17, wherein the two or more phosphor-containing white LEDs are combined based on a predicted lumen maintenance over time for each of the LEDs, and the lumen maintenance is an exponentially decaying lumen maintenance.

19. The system of claim 17, wherein the model is based on either (X, Y, Z) tri-stimulus coordinates, or (Y, u, v)-coordinates, or both.

* * * * *